(12) United States Patent
Vibet et al.

(10) Patent No.: US 7,253,883 B2
(45) Date of Patent: Aug. 7, 2007

(54) MACHINE FOR EXPOSING PRINTED CIRCUIT PANELS WITH GAS BALLOONS AND MECHANICAL SPACERS

(75) Inventors: Gilles Vibet, Petit Quevilly (FR); Arnaud Le Boucher, Darnetal (FR)

(73) Assignee: Automa-Tech, Val-de-Rueil (FR)

( * ) Notice: Subject to any disclaimer, the term of this patent is extended or adjusted under 35 U.S.C. 154(b) by 44 days.

(21) Appl. No.: 10/521,408

(22) PCT Filed: Jul. 17, 2003

(86) PCT No.: PCT/FR03/02256

§ 371 (c)(1),
(2), (4) Date: Jan. 18, 2005

(87) PCT Pub. No.: WO2004/010226

PCT Pub. Date: Jan. 29, 2004

(65) Prior Publication Data

US 2005/0213073 A1 Sep. 29, 2005

(30) Foreign Application Priority Data

Jul. 17, 2002 (FR) .................................. 02 09030

(51) Int. Cl.
*G03B 27/64* (2006.01)
(52) U.S. Cl. ....................................................... 355/76
(58) Field of Classification Search ............ 355/72–74, 355/76, 75
See application file for complete search history.

(56) References Cited

U.S. PATENT DOCUMENTS

| 5,164,284 A | 11/1992 | Briguglio et al. |
| 5,907,230 A | 5/1999 | Sorel et al. |
| 6,157,441 A | 12/2000 | Ohlig |

FOREIGN PATENT DOCUMENTS

| DE | 198 51 575 A1 | 5/2000 |
| EP | 0 618 505 A1 | 10/1994 |
| GB | 2 281 980 A | 3/1995 |

*Primary Examiner*—Henry Hung Nguyen
*Assistant Examiner*—Chia-how Michael Liu
(74) *Attorney, Agent, or Firm*—Connolly Bove Lodge & Hutz LLP

(57) ABSTRACT

The invention relates to an exposure machine for printed circuit panels. The machine comprises:
   a support (26) for said panel (24);
   a moving artwork support (10) comprising a substantially rectangular frame (12) and a transparent plate (14) suitable for receiving said artwork;
   means (22) for establishing peripheral sealing;
   means for establishing suction in the volume;
   at least one deformable leaktight balloon (30, 32) disposed between said support and said transparent plate around at least a portion of said panel; and
   a source of gas under pressure at a pressure greater than the pressure of said suction for the purpose of feeding said balloon, thus that when suction is established in said volume, the periphery of said transparent plate presses against said balloon.

10 Claims, 4 Drawing Sheets

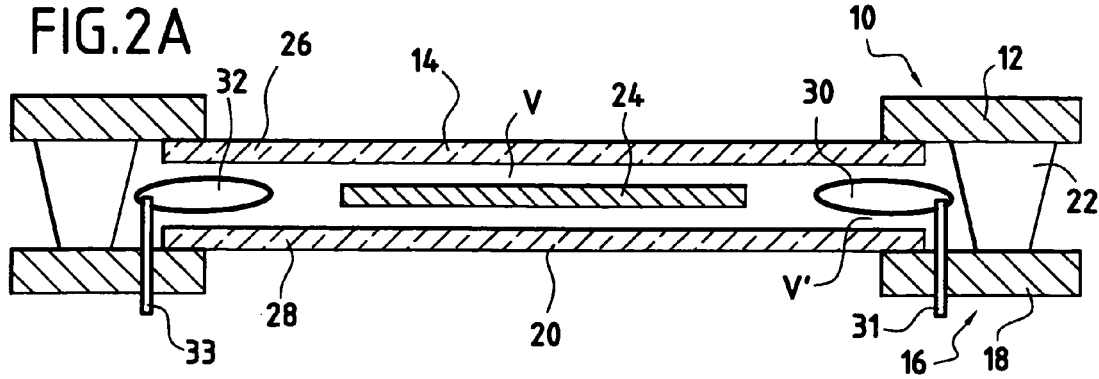
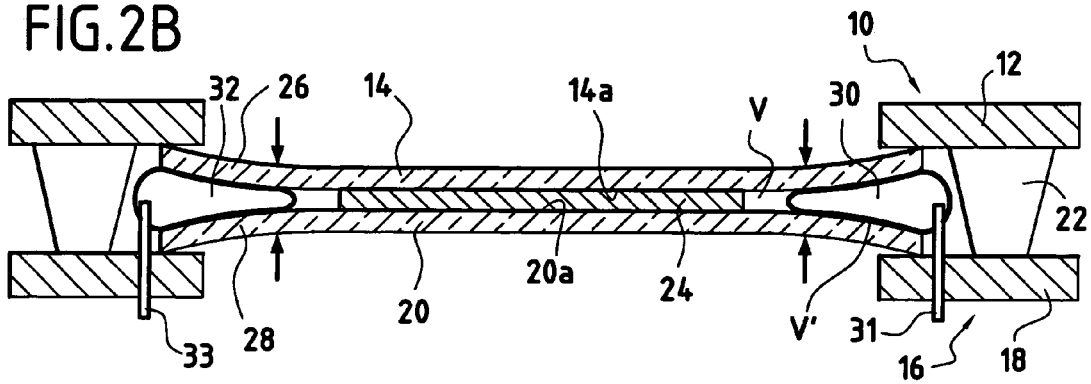
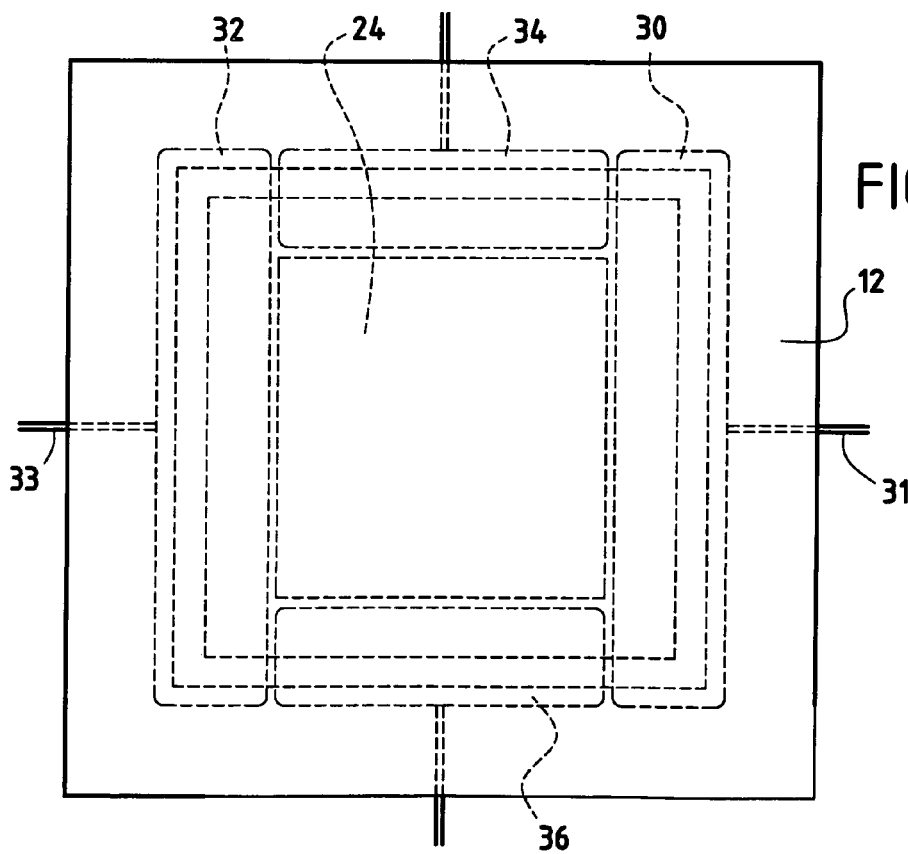

MACHINE FOR EXPOSING PRINTED CIRCUIT PANELS WITH GAS BALLOONS AND MECHANICAL SPACERS

CROSS-REFERENCE TO RELATED APPLICATIONS

This application is a U.S. National Stage entry under 35 U.S.C. §371 of co-pending International Patent Application No. PCT/FR2003/002256, filed on Jul. 17, 2003 by VIBET, Gilles and LE BOUCHER, Arnaud entitled A MACHINE FOR EXPOSING PRINTED CIRCUIT PANELS, the entire contents of which is incorporated by reference. As in the International Application No. PCT/FR2003/002256, priority is claimed to French Patent Application No. 02 09030, filed on Jul. 17, 2002, the entire contents of which is incorporated by reference, and for which priority is claimed under 35 U.S.C. § 119.

The present invention relates to a machine for exposing both sides of printed circuit panels, and more particularly, in such a machine, the invention relates to making artwork supports.

Exposure machines are installations that enable artwork to be placed facing at least one face of a printed circuit panel that is to be made, with the panel being subjected to a light beam through the artwork in order to print on a photosensitive layer previously disposed on at least one face of said panel. Depending on circumstances, the exposure machine may present two artwork supports disposed on either side of the panel so as to make a double-sided printed circuit, or only a single artwork support for making a single-sided printed circuit. The artwork is constituted by a full-scale image of the printed circuit.

The various dispositions of an exposure machine are described, in particular in European patents EP 0 618 505 and EP 0 807 855.

With reference to accompanying FIGS. 1A, 1B, and 1C, there follows a description of a known embodiment of an exposure machine, and more precisely of the top and bottom artwork supports of that machine.

The top artwork support 10 comprises a metal frame 12 of substantially rectangular shape having a transparent window 14 fastened thereto for receiving the top artwork. The bottom artwork support 16 is likewise constituted by a substantially rectangular metal frame 18 likewise having a transparent window 20 fastened thereto. A gasket 22 is fastened to the bottom face of the frame 12 for supporting the top artwork, for example. The printed circuit panel 24 for exposure is placed between the top and bottom windows 14 and 20. The windows 14 and 20 may comprise transparent plates made of glass or of some material other than glass.

In the following step shown in FIG. 1B, the top artwork support 10 is moved towards the bottom artwork support 16 (or vice versa), and the gasket 22 is inflated so as to seal off a volume V defined by the top window 14, the bottom window 20, and the gasket 22. In the following step, suction is established inside the volume V by vacuum pump means (not shown). It will be understood that because the volume V is evacuated, the windows 14 and 20 tend to deform, in particular in their central regions, so as to press against the two faces 24a and 24b of the printed circuit panel 24. The two artworks are thus moved as close possible to the faces of the printed circuit panel in order to press them against said faces. Tests have been performed that show that the quality of transfer is spoilt whenever any gaps remain between the face of the printed panel and the artwork, even when such gaps are localized and of very small size, e.g. a few tens of microns (μm).

As shown in FIG. 1C, in the peripheral regions 26 and 28, i.e. in the regions of the windows 14 and 20 that surround the panel 24 inside the frames 12 and 18, the windows are subjected to localized stresses that can be very large at certain points because of the deformation of said windows. Experience shows that in the peripheral zones 26 and 28 of the windows, the applied stresses can lead to the windows breaking.

It is known that printed circuit panels can have a very wide variety of dimensions. Naturally, it is very desirable for the exposure machine to enable panels of different sizes to be exposed, which is why the peripheral zones 26 and 28 are present except under the special circumstance of panels having the largest possible dimensions.

It will be understood that breakage of the windows leads firstly to the cost of replacing a window, which is high since such windows need to present a very high degree of purity, and secondly, and above all, it makes the exposure machine unavailable. Naturally, it will be understood that such machines are intended to operate automatically at high rates of throughput in order to make the manufacture of printed circuits profitable. Such risks of breaking the windows therefore have very considerable economic implications.

In addition, the trend in the market is to reduce very considerably the width of the conductor tracks on printed circuits in order to miniaturize such circuits. This situation leads to an increase in track density per unit area on the printed circuit. This leads to problems of transferring the image because of the increase in precision required for defining conductor tracks. In order to be able to comply with such levels of performance, it is necessary to move the window carrying the artwork closer to the printed circuit faces so as to press the artwork against the faces of the panel, as mentioned above. To do this, it is necessary to increase the extent to which the space between the windows is evacuated. However a higher vacuum between the windows also leads to additional stresses being created in the windows and thus increases the risks of breakage when the vacuum is taken beyond a certain limit.

To remedy that drawback, proposals have been made to place mechanical spacers or shim in register with the peripheral zones 26 and 28 in an attempt to reduce the stresses applied to these portions of the windows when the volume V is evacuated.

It turns out firstly that such mechanical spacers, which are necessarily highly localized, do not provide a satisfactory solution to the problem of limiting localized stress levels in the windows, so the rate at which windows break remains very significant, and in any event too high, and secondly the distance between the windows while the space is being evacuated naturally depends on the thickness of the printed circuit panel so it is necessary to have spacers of different thicknesses in order to match the different thicknesses of the printed circuits. This requirement makes it difficult to automate the operation of exposing series of printed circuit panels of different thicknesses to light radiation. In addition, there is a risk of an operator choosing the wrong spacers.

There therefore exists a real need to have an exposure frame and more particularly artwork supports that provide an effective reduction in the stresses applied to the windows, thereby achieving a considerable reduction in window breakages for a given level of vacuum, or enabling the level of vacuum between the windows to be increased without increasing the risk of breakage.

Nevertheless, it is desirable for such exposure frames to be compatible with exposure machines being used for mass production.

According to the invention, to achieve this object, the exposure machine for printed circuit panels comprises:

- a first artwork support comprising a substantially rectangular frame and a transparent plate suitable for receiving said artwork, said plate being secured via its periphery to said frame;
- a second artwork support constituted by a substantially rectangular frame and a transparent plate suitable for receiving said artwork, said plate being secured to said frame via its periphery, one of said supports being movable relative to the other, said panel being designed to be placed between said supports;
- means for providing sealing between said frames of said supports when said frames are pressed one against the other; and
- means for establishing suction in the volume defined by said frame, said sealing means, and said support;
- said machine being characterized in that it further comprises:
- at least one deformable leaktight balloon disposed between said transparent plate around at least a portion of said panel;
- a source of gas under pressure at a pressure greater than the pressure of said suction; and
- at least one pipe for causing said balloon to communicate with said source of pressure thus serving, when suction is established in said volume, to cause the periphery of said transparent plate to press against said balloon.

In addition, the term "source of gas under pressure" should be understood either as the gaseous environment of the machine, which is at atmospheric pressure, or optionally as an enclosure containing a gas at a pressure that is regulated and greater than that of the suction.

It will be understood that because at least one deformable leaktight balloon is disposed between the windows of the artwork supports around the printed circuit panels, and because said balloon is maintained at least at atmospheric pressure while the volume between the artwork support windows is being evacuated, greater and greater relative pressure appears within the deformable balloon. The balloon thus takes up the shape of the inside space of the windows while the windows are deforming under the effect of suction. The balloon thus serves to ensure that the stresses applied to the windows in said peripheral region are made uniform, thereby avoiding the creation of large localized stresses which could lead to a window being destroyed. It will also be understood that in these critical zones that are fitted with a leaktight balloon, equal pressures are achieved on either side of the window, thereby considerably reducing stresses and thus any risk of breakage.

Preferably, the machine includes a plurality of leaktight deformable balloons surrounding said panel, each balloon being connected to said source of gas under pressure by a pipe, said balloons occupying the major fraction of the space extending between the periphery of said panel and the frames.

This optimizes deformation of the windows, even if the printed circuit panel has dimensions that are significantly smaller than those of the artwork support windows.

Preferably, several sets of deformable balloons are made available having different dimensions. This makes it possible to change the deformable balloons as a function of the dimensions of the panel.

In an improved embodiment, the machine further comprises at least one mechanical spacer interposed between said frame and the support in order to control deformation of the frame proper in addition to controlling the deformation of the window fastened to the frame, where deformation of the window is controlled as explained above by putting the deformable leaktight balloon into place.

Other characteristics and advantages of the invention appear better on reading the following description of various embodiments of the invention given as non-limiting examples.

The description refers to the accompanying figures, in which:

FIGS. 1A to 1C, described above, show top and bottom artwork supports in a prior art exposure machine, and they show how it operates;

FIGS. 2A and 2B are vertical sections through an embodiment showing the principle of the invention for a double-sided exposure machine;

FIG. 2C shows in simplified manner a preferred configuration for implanting inflatable deformable balloons between the artwork support windows;

Figure 1A:
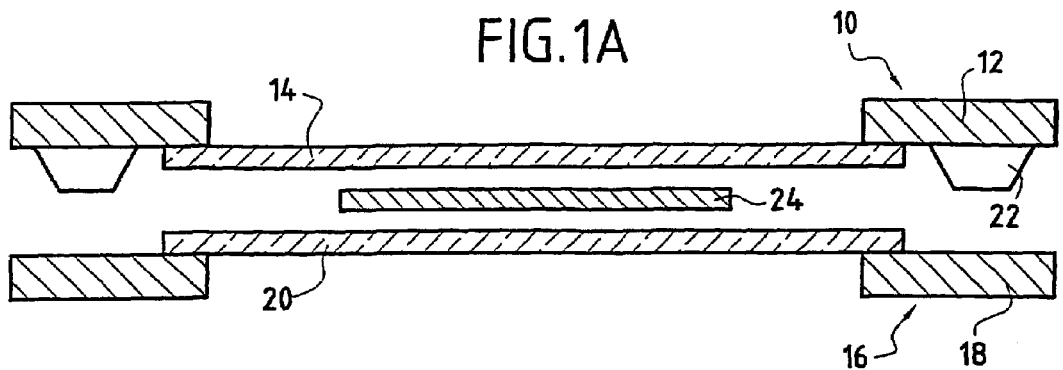

With reference initially to FIGS. 2A to 2C, there follows a simplified description of an exposure machine in accordance with the invention, and more specifically description of the bottom and top artwork supports thereof.

FIG. 2A shows the top artwork support 10 with its frame 12 and its window 14, together with the bottom artwork support 16 with its frame 18 and its window 20. This figure also shows the peripheral sealing gasket 22 secured, by way of example, to the top frame 12, and the printed circuit panel 24 for exposure which is placed between the two windows 14 and 20. Finally, references 26 and 28 designate the peripheral zones in this figure, respectively of the windows 14 and 20, close to their zones where they are fastened to the frames 12 and 18.

Typically, the windows are about 8 millimeters (mm) thick.

According to an essential characteristic of the invention, one or more deformable leaktight balloons 30 are placed in the peripheral portion V' of the volume V around the panel 24. In FIG. 2A there can be seen two balloons 30 and 32. The balloons 30 and 32 are connected to respective pipes 31, 33 leading to a source of gas under pressure in the meaning given above. In the particular example described, the source of gas under pressure is ambient air at atmospheric pressure. The balloons 30 and 32 are kept permanently in connection with the source of gas under pressure via the pipes 31 and 33.

Figure 1B:
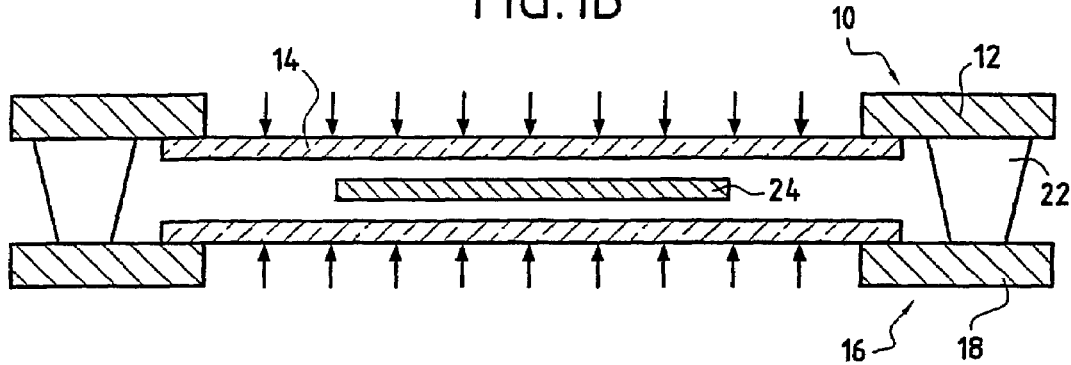
Figure 1C:
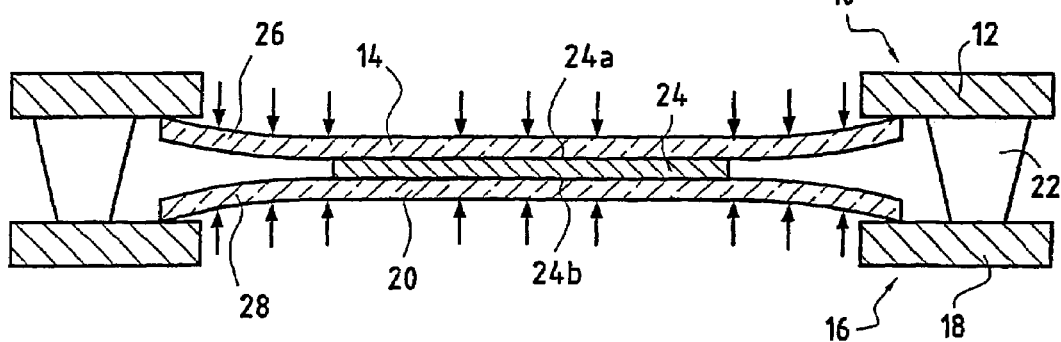

As shown in FIG. 2B, when suction is established in the volume V using conventional means, suction is naturally also obtained in the peripheral volume V', so the pressure inside the balloons 30, 32 increases relative to the pressure in the volume V. The balloons 30 and 32 therefore expand in relative terms so as to press against the inside faces 14a and 20a of the windows 14 and 20, in their peripheral zones 26 and 28. As the two windows 14 and 20 move towards each other so as to press against the faces of the panel 24, the balloons 32 and 30, which remain in communication with the sources of compressed gas, can adapt in pressure, and in any event in shape, so as to be pressed effectively against the inside faces 14a and 20a of the deforming windows. As the peripheral zones 26 and 28 of the windows become curved, the inside faces of the windows thus remain pressed for the greater parts of their areas against the balloons 30 and 32. Thus, the stresses due to the windows deforming under the effect of the suction are distributed uniformly over these peripheral zones 26 and 28 of the windows. This therefore achieves an effective reduction in the local stresses compared with those that would be obtained using the prior systems as described with reference to FIGS. 1A to 1C. This serves to decrease very significantly the risk of the windows 14 or 20 breaking. Typically, the suction established between the windows is of the order of 0.5 bars relative to atmospheric pressure.

FIG. 2C is a plan view of one possible configuration of inflatable elements. In this figure, there can be seen four inflatable elements 30, 32, 34, and 36 disposed along each of the edges of the printed circuit panel 24 and facing the peripheral zones 26 and 28 of the two windows. Each inflatable balloon is associated with a pipe given a generic reference C leading to the source of gas under pressure which will normally be atmospheric pressure.

Each balloon is substantially rectangular in shape and the "horizontal" dimensions of a balloon are much greater than its thickness dimension, i.e. the distance between the windows before beginning to establish the vacuum. The machine preferably has several sets of balloons of dimensions that correspond to the amount of peripheral space left empty by printed circuit panels of different dimensions.

Figure 3:
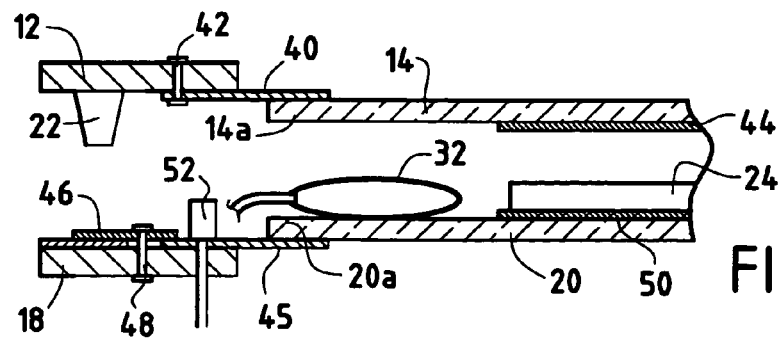
FIG. 3 is a detailed fragmentary vertical section view of the top and bottom artwork supports.
Figure 4:
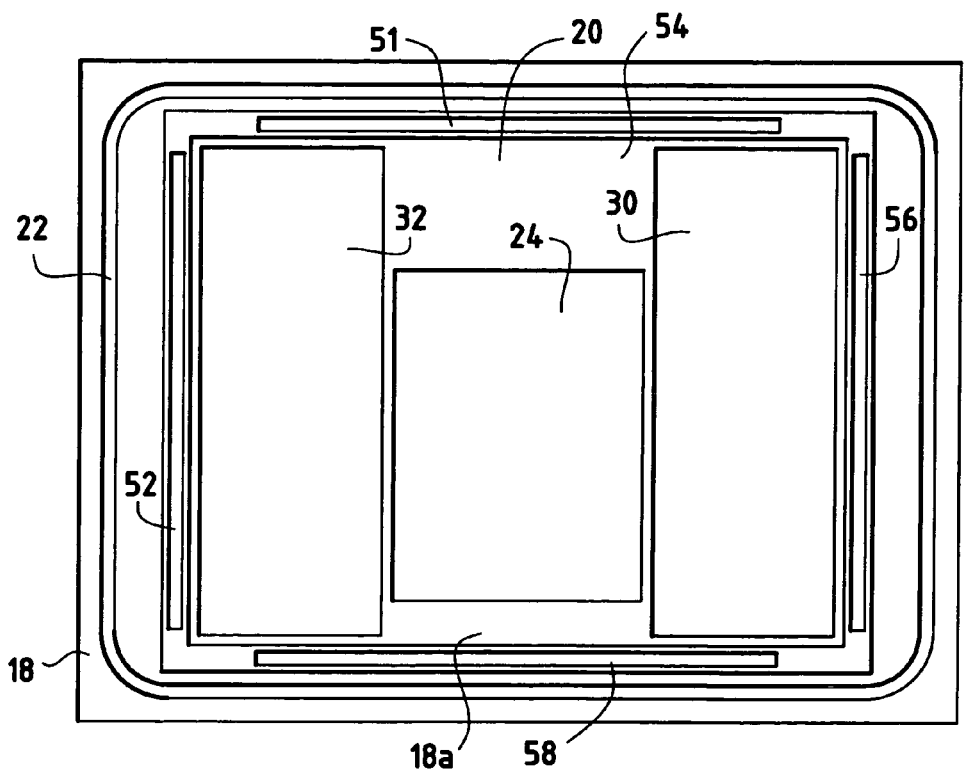
FIG. 4 is a plan view of the artwork supports showing a various embodiment of the inflatable balloons.

With reference to FIGS. 3 and 4, there follows a more detailed description of a preferred embodiment of the invention.

FIG. 3 shows the top artwork support 10 constituted by the frame 12 and the window 14, together with the bottom artwork support 16 constituted essentially by the frame 18 and the bottom window 20.

More precisely, in this preferred embodiment, the top window 14 has its periphery 14a fastened to an intermediate frame 40 constituted by a thin metal sheet. This fastening is preferably performed by adhesive. In turn, the sheet 40 is fastened to the frame 12, e.g. by screws such as 42. Finally, in this figure, there can be seen the top artwork 44.

For the bottom artwork support, the window 20 has its periphery 20a fastened to an intermediate frame 45 constituted by a thin metal sheet. Fastening is likewise preferably performed by adhesive. The intermediate sheet 45 is clamped between the frame 18 and a backing plate 46, itself screwed to the frame proper 18 via screws such as 48. The inflatable gasket 22 comes into contact with the backing plate 46 when the two artwork supports are in their working positions. This figure also shows the bottom artwork 50 and an automatic mechanical spacer system 52 of adjustable thickness that is described in greater detail below. At this point, it suffices to state that the mechanical spacer 52 serves to keep the frames 12 and 18, together with the top and bottom artwork supports 10 and 16, mutually parallel in spite of the suction established between the windows 14 and 20, i.e. to prevent or at least restrict deformation thereof.

Finally, this figure shows an inflatable leaktight balloon 32 which is disposed between the panel 24 and the edge 44 of the frame. This balloon 32 is disposed facing critical zones 26 and 28 of the windows 14 and 20.

As shown better in FIG. 4, in this embodiment, the exposure frame in fact contains two inflatable balloons 30 and 32 extending along the short sides of the frame 18. These inflatable balloons or bags are disposed on either side of the panel 24. In this embodiment, and in compliance with the usual practice, the panel 24 is located close to the edge 18a of the bottom artwork support frame, said edge constituting the reference edge for the panel between the bottom and top artwork supports. This edge is the edge which is closest to the operator. In a variant, it is also possible to put another deformable balloon into place in the zone identified by the dashed lines referenced 54, said other balloon being connected to atmospheric pressure or to a suitable pressure for enabling it to fill this space. This naturally depends on the dimensions of the printed circuit panel 24.

The inflatable balloons preferably occupy the major fraction of the peripheral volume V'.

Figure 5:
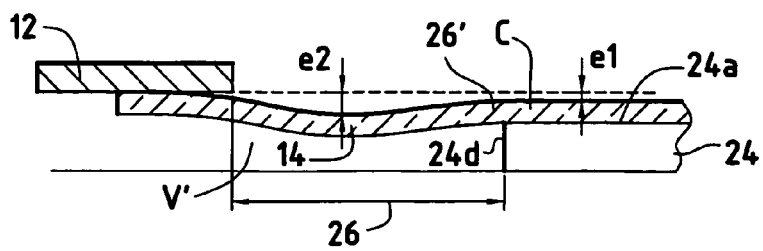
FIG. 5 is a simplified diagram in section showing the deformation of the window in the absence of an inflatable balloon.

FIG. 5 is a diagram showing the deformation of the top window 14 in the absence of inflatable deformable balloons of the invention.

As can be seen in this figure, under the effect of the vacuum established between the two windows in the space V' surrounding the panel 24, the central portions of the windows, referenced C, come to press against the top and bottom faces of the panel 24, thereby entraining a small amount of displacement e1 of each of the windows. At most, this displacement is of the order of several tenths of a millimeter. In contrast, it can be seen that in the peripheral zones 26, 28 of the windows extending between the frames and the edge of the panel 24, the windows deform to a much greater extent since there is nothing to oppose such deformation, which results from the pressure difference that exists between the two faces of this portion of window. This causes this portion of window to be moved through a distance e2 which is much greater than the distance e1. It is in this zone that the greatest stresses are established, and thus the risks of breakage are at their greatest. The risks of breakage are particularly great in the zone 26' of the window 14 corresponding to the edge 24d of the panel since this zone corresponds to a zone in which stresses are concentrated.

From FIG. 5, it will be understood that, because of the presence of the deformable inflatable balloon 30 or 32, precisely because it is disposed in the zone 26, equal pressures are maintained on either side of the portion 26 of the window. The resulting deformation of the windows between their edges fixed to the frames and their central portions C pressing against the faces of the panel 24 is thus regular, and above all limited. This regular deformation is shown in dashed lines in FIG. 5 and is achieved because of the presence of the deformable inflatable balloons 30 or 32 and serves to avoid significant localized stresses being built up, thus avoiding any risk of the windows breaking.

As mentioned briefly above, it is preferable to provide a mechanical spacer 52 of controllable thickness between the top and bottom frames 12 and 18 of the artwork supports, which spacer is interposed between these two frames inside the outline defined by the sealing gasket 22. For example, the mechanical spacers can be fixed to the intermediate frame 46 of the bottom artwork support and serving to support the bottom window 20.

In a concrete embodiment, four mechanical spacers of controllable thickness 52, 54, 56, and 58 are provided extending along the four sides of the frame 18 of the bottom artwork support.

As mentioned above, these mechanical spacers 52 to 58 are interposed between the artwork support frames which are made of metal. The spacers thus serve to prevent the frames themselves deforming under the effect of the vacuum, so the spacers act on parts that are relatively strong. They therefore do not in any way present the drawback of the spacers described above with reference to the prior art.

In addition, as explained below in greater detail the thickness of the spacers 52 to 58 can be adjusted automatically. The controllers controlling the operation of the entire exposure machine can thus respond to information about the thickness of the printed circuit panel for exposure by adjusting the mechanical spacers 52 to 58 to an appropriate thickness without disturbing the operation of the automatic production line including the exposure machine in question.

Figure 6A:
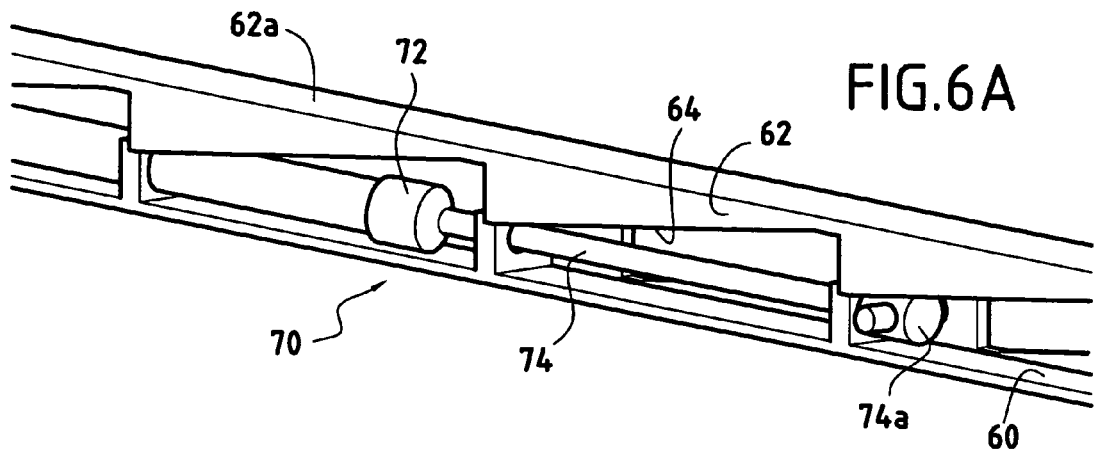
FIGS. 6A, 6B, and 6C show a preferred embodiment of adjustable mechanical spacers interposed between the artwork carriers.
Figure 6B:
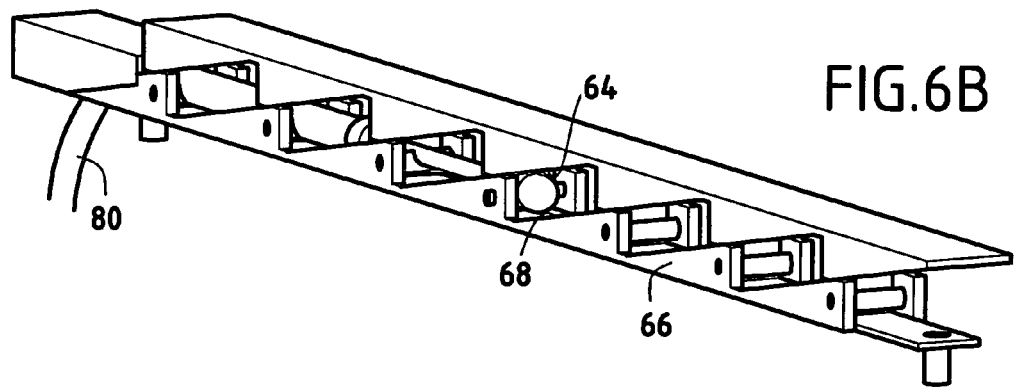
Figure 6C:
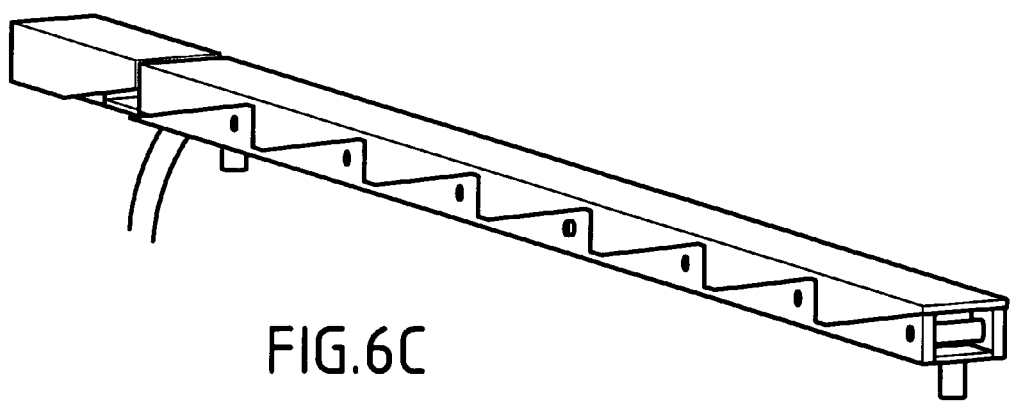

With reference to FIGS. 6A, 6B, and 6C, there follows a description of a preferred embodiment of mechanical spacers of adjustable thickness.

The automatically adjustable mechanical spacer 52 comprises a base 60 which is fastened to the bottom frame 18 of the bottom artwork support, and a top spacer portion 62 whose top face 62a comes into contact with the top frame 12 for adjusting the spacing between the two frames. The top portion 62 is horizontally constrained relative to the base 60 and is vertically movable. The bottom face of the top portion 62 defines sloping ramps such as 64 at an angle of about 10° relative to the horizontal. This angle is determined as a function of the coefficient of friction of the material from which the spacer is made so as to enable the thickness of the spacer to be controlled irreversibly.

Vertical displacement of the top portion 62 is controlled by the bottom portion 66 of the spacer which is movable horizontally in translation relative to the base 60 and relative to the top portion 62 of the spacer. The top face of the bottom portion of the spacer has sloping ramps such as 68 that are complementary to the ramps 64, presenting the same angle of inclination relative to the horizontal.

It will be understood that by moving the bottom portion 66 of the spacer horizontally, the action of the ramps 68 on the ramps 64 causes the top portion 62 of the spacer to be lifted through a height that is proportional to the horizontal displacement.

The horizontal displacement of the bottom portion 66 of the spacer is controlled by a cable system 70. It comprises a body 72 secured to the base 60 and in which a rod 74 can move. The end 74a of the rod 74 is secured to the bottom portion 66 of the spacer. The rod is itself controlled by a rigid cable 80 that provides positive displacement. The cable can be actuated hydraulically or pneumatically.

The invention claimed is:

1. A printed circuit panel exposure machine comprising:
   a first artwork support comprising a first substantially rectangular frame and a first transparent plate suitable for receiving said artwork, said first plate being secured via its periphery to said first frame;
   a second artwork support comprising a second substantially rectangular frame and a second transparent plate secured via its periphery to said second frame and suitable for receiving said artwork, one of said first and second supports being movable relative to the other, said panel being placed between said first and second supports;
   sealing means for providing sealing between said first and second frames of said supports when said first and second frames are pressed one against the other;
   means for establishing suction in the volume defined by said first and second artwork supports and said sealing means;
   at least one deformable leaktight balloon disposed between said first and second transparent plates, said at least one deformable leaktight balloon being in contact with both transparent plates around at least a portion of said panel outside the periphery of said panel, whereby no part of said at least one deformable leaktight balloon is interposed between main faces of said panel and said first and second transparent plates;
   a source of gas under pressure at a pressure greater than the pressure of said suction; and
   at least one pipe for causing said at least one deformable leaktight balloon to communicate with said source of pressure thus serving, when suction is established in said volume, to cause the periphery of said first and second transparent plates to press against said at least one deformable leaktight balloon.

2. A machine according to claim 1, wherein said at least one deformable leaktight balloon comprises a plurality of deformable leaktight balloons surrounding said panel, each of said deformable leaktight balloons being connected to said source of gas under pressure by a pipe, said deformable leaktight balloons occupying the major fraction of the space extending between the periphery of said panel and the first and second frames.

3. A machine according to claim 2, further comprising a plurality of mechanical spacers interposed between said first and second frames.

4. A machine according to claim 3, wherein said spacers are adjustable in thickness.

5. A machine according to claim 2, including a plurality of sets of deformable leaktight balloons of dimensions adapted to the dimensions of panels to be exposed.

6. A machine according to claim 1, further comprising a plurality of mechanical spacers interposed between said first and second frames.

7. A machine according to claim 6, wherein said spacers are adjustable in thickness.

8. A machine according to claim 1, wherein said at least one deformable leaktight balloon is of horizontal dimensions much greater than its thickness.

9. A machine according to claim 1, including a plurality of sets of deformable leaktight balloons of dimensions adapted to the dimensions of panels to be exposed.

10. A printed circuit panel exposure machine comprising:
    a first artwork support comprising a first substantially rectangular frame and a first transparent plate suitable for receiving said artwork, said first plate being secured via its periphery to said first frame;
    a second artwork support comprising a second substantially rectangular frame and a second transparent plate secured via its periphery to said second frame and suitable for receiving said artwork, one of said first and second supports being movable relative to the other, said panel being placed between said first and second supports;
    a plurality of mechanical spacers interposed between said first and second frames, wherein said spacers are adjustable in thickness;
    sealing means for providing sealing between said first and second frames when said first and second frames are pressed one against the other;
    means for establishing suction in the volume defined by said first and second artwork supports and said sealing means;
    at least one deformable leaktight balloon disposed between said first and second transparent plates around at least a portion of said panel;
    a source of gas under pressure at a pressure greater than the pressure of said suction; and at least one pipe for causing said at least one deformable leaktight balloon to communicate with said source of pressure thus serving, when suction is established in said volume, to cause the periphery of said first and second transparent plates to press against said at least one deformable leaktight balloon.

* * * * *